US005519662A

United States Patent [19]
Ishibashi et al.

[11] Patent Number: 5,519,662
[45] Date of Patent: May 21, 1996

[54] SEMICONDUCTOR MEMORY DEVICE

[75] Inventors: Koichiro Ishibashi, Kodaira; Kiyotsugu Ueda; Kunihiro Komiyaji, both of Hachioji, Japan

[73] Assignee: Hitachi, Ltd., Tokyo, Japan

[21] Appl. No.: 339,611

[22] Filed: Nov. 15, 1994

[30] Foreign Application Priority Data

Dec. 3, 1993 [JP] Japan .................................. 5-303766

[51] Int. Cl.$^6$ ........................................ G11C 7/00
[52] U.S. Cl. .................... 365/207; 365/208; 365/189.11; 327/56
[58] Field of Search ................................ 365/205, 207, 365/208, 190, 154, 189.11; 327/52, 56

[56] References Cited

U.S. PATENT DOCUMENTS 4,962,482  10/1990  Jinbo ................................. 365/189.11
5,029,138   7/1991  Iwashita .............................. 365/208

OTHER PUBLICATIONS

1992 IEEE International Solid State Circuit Conference, Digest of Technical Papers, pp. 208–209, "A 7ns 140 mW 1 Mb CMOS SRAM with Current Sense Amplifier" by K. Sasaki et al.

Primary Examiner—Joseph A. Popek
Attorney, Agent, or Firm—Kenyon & Kenyon

[57] ABSTRACT

In a semiconductor memory device, amplification of data is realized with a high speed without influences of fluctuations at fabrication. Potentials of a common data line pair are set at a reference voltage by current negative feedback of differential amplifiers. In this way signal amplitude in the common data line pair is decreased. A current from a memory cell is transformed into a voltage by transistors in a negative feedback loop. Even if there are fluctuations or an offset voltage in the differential amplifiers, it is possible to decrease the signal amplitude in the common data line pair and to realize a high speed data amplification with low electric power consumption.

18 Claims, 7 Drawing Sheets

FIG. 1A

Vw−Vth<Vref

Vcc−Vth<Vref

SEMICONDUCTOR MEMORY DEVICE

BACKGROUND OF THE INVENTION

The present invention relates to a semiconductor memory device and in particular to a semiconductor memory device, in which signal amplitude in data lines is small and data in a memory cell can be read out with a high speed.

A semiconductor memory device capable of reading out data stored in a memory cell with a high speed, which is known in the prior art, is described in 1992 IEEE International Solid State Circuit Conference. Digest of Technical Papers, pp. 208–209.

In order to shorten address access time for reading out data from a semiconductor memory device having two lines, i.e. a data line pair, generally it is useful to decrease signal amplitude in the data lines. Denoting the signal amplitude in the data line pair by $\Delta V$, parasitic capacitance of the data lines by C and current flowing through transistors driving the data lines by I, time t necessary for varying potential of the data lines is given by a following equation;

$$t = C\Delta V/I.$$

Consequently the time t is decreased by decreasing the signal amplitude $\Delta V$ and thus a high speed operation is made possible. By the prior art techniques, in order to decrease the signal amplitude in the data lines, a current-sense type sense amplifier was used. Current flowing through a memory cell was introduced into a sense amplifier which transformed into voltage.

SUMMARY OF THE INVENTION

It can be said that the prior art example is useful for realizing, to a certain extent a high speed operation of the semiconductor memory device. However, as a result of a detailed study, it was recognized that in the prior art example there was a limit for increasing the speed due to following reasons.

That is, in the sense amplifier used in the prior art example, when there are fluctuations in characteristics of the MOSFETs constituting the sense amplifier and the offset voltage of the sense amplifier increases, delay time increases. For example, in the case where threshold voltages of a pair of P channel MOSFETs constituting the sense amplifier differ from each other, amplification delay time increases significantly. In that case, a difference in the threshold voltage of 20 mV gives rise to increase in the delay time of about 2 ns. Further for differences in the threshold voltage greater than 50 mV the sense amplifier does not work. Threshold voltages of two MOSFETs are usually not perfectly in accordance with each other. There is an average difference of about 20 mV therebetween. Consequently, using a prior art sense amplifier, it is difficult to be free from increase in the delay time due to the difference between threshold voltages. That is, the prior art sense amplifier had a problem that in an ideal case where there is no difference in the threshold voltage, it is possible to decrease signal amplitude in the data lines and to realize a high speed amplification. In the case where the offset voltage is great, however, the delay time increases.

Figure 2:
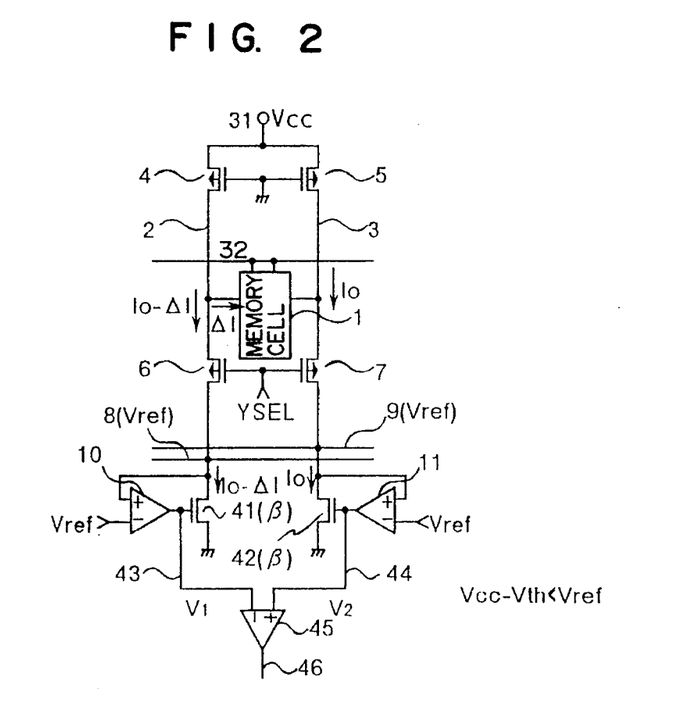
FIG. 2 is a circuit diagram showing a first embodiment of the present invention, in which the present invention is applied to a semiconductor memory device having a static type memory cell.

According to a mode of realization of the present invention (refer to FIG. 2);

a data line pair (2, 3) of a memory cell (1) are connected with a common data line pair (8, 9) through selector switches (6, 7);

this common data line pair (8, 9) are connected with drains of two sense MOSFETs (41, 42), respectively;

gate electrodes of these two sense MOSFETs (41, 42) are connected with output terminals of differential amplifiers (10, 11) for setting potentials of the common data line pair (8, 9), respectively;

a reference voltage (Vref) is inputted to negative input terminals (−) of these two differential amplifiers (10, 11); and the common data line pair (8, 9) are connected with positive input terminals (+) of these two differential amplifiers (10, 11), respectively.

Further, according to this mode of realization, the reference voltage (Vref) inputted to the negative input terminals (+) of the differential amplifiers (10, 11) is higher than a power supply voltage (Vcc) and also than a difference obtained by subtracting the threshold voltage (Vth) of the sense MOSFETs (41, 42) from the power supply voltage.

That is, a condition $$Vcc-Vth<Vref$$

is satisfied. As a result, the sense MOSFETs (41, 42) work in a saturation region. That is, it is possible to transform current ($\Delta I$) flowing through the memory cell (1) into a voltage independently of the offset voltage of the differential amplifiers (10, 11), owing to the fact that the sense MOSFETs (41, 42) work in a region where drain conductance doesn't vary, independently of variations in drain voltage.

This condition is deduced from a condition that a value (Vcc−Vth) obtained by subtracting the threshold voltage (Vth) from the maximum value of the gate voltage of the sense MOSFETs (41, 42) (i.e. maximum output voltage Vcc of the differential amplifiers (10, 11)) is higher than the drain-source voltage VDS (Vref) of the sense MOSFETs (41, 42), and as a result the sense MOSFETs (41, 42) work in the saturation region.

According to a representative mode of realization (FIG. 2) of the present invention, each of the differential amplifiers (10, 11) and corresponding one of the sense MOSFETs (41, 42) constitute a feedback circuit and the gate voltages of the sense MOSFETs are controlled so that the potentials of the common data line pair (8, 9) are fixed at a same value as the reference voltage (Vref). Therefore, since both the potentials of the common data line pair (8, 9) are kept at values close to the reference voltage (Vref) and thus the potential difference therebetween can be maintained at a very small value, delay time can be decreased.

Next, an operation for transforming the current ($\Delta I$) flowing through the memory cell (1) into a voltage proportional thereto, independently of the offset voltage of the differential amplifiers (10, 11), will be explained.

In FIG. 2, the current flowing through the data line pair (2, 3), the common data line pair (8, 9) and the sense MOSFETs (X 41, 42X) in a state where no current ($\Delta I$) flows through the memory cell (1) is represented by $I_0$.

When a word line (32) is selected and a current $\Delta I$ flows through the memory cell (1), current flowing a data line (2), a common data line (8) and a sense MOSFET (41) is charged into $I_0-\Delta I$. Denoting conductances of the MOSFETs (41 and 42) by $B_{41}$ and $B_{42}$; gate voltages thereof by $V1(V_{GS41})$ and $V2(V_{GS42})$; threshold voltages thereof by $Vth_{41}$, $Vth_{42}$; and offset voltages of the differential amplifiers by $Voff_{10}$ and $Voff_{20}$, potentials of the common data line pair. i.e. drain-source voltages of the MOSFETs (41 and 42), are given by $Vref+Voff_{10}$ and $Vref+Voff_{20}$, respectively.

At this time, since the MOSFETs (41, 42) work in the saturation region, drain currents flowing through the respective transistors are given by following equations, independently of the respective drain-source voltages $V_{ref}+V_{off_{10}}$ and $V_{ref}+V_{off_{20}}$:

$$Io - \Delta T = \frac{B_{41}}{2} (V_{GS41} - Vth_{41})^2 \quad (1)$$

$$Io = \frac{B_{42}}{2} (V_{GS42} - Vth_{42})^2 \quad (2)$$

Therefore the gate voltages V1 ($=V_{GS41}$) and V2 ($=V_{GS42}$) of the MOSFETs (41 and 42) are given by following equations, respectively;

$$V1 = V_{GS41} = Vth_{41} + \sqrt{\frac{2(Io - \Delta I)}{B_{41}}} \quad (3)$$

$$V2 = V_{GS42} = Vth_{42} + \sqrt{\frac{2Io}{B_{42}}} \quad (4)$$

When the MOSFETs (41 and 42) are fabricated so that the channel length L and the channel width W of the MOSFET 41 are in accordance with the channel length L and the channel width W of the MOSFET (42) with a high precision, the conductances $\beta_{41}$ and $\beta_{42}$ of the MOSFETs (41, 42) are also in accordance with each other with a high precision. On the other hand, if the conductances $\beta_{41}$ and $\beta_{42}=\beta$ of the MOSFETs (41, 42) are set at a satisfactorily small value so that variations $\sqrt{2\Delta I/\beta X}$ in the gate-source voltage of the MOSFET 41 due to the current ($\Delta I$) flowing through the memory cell (1) are greater than the difference between the threshold voltages $Vth_{42}-Vth_{41}$ of the MOSFETs (41, 42), a following equation is obtained:

$$V2 - V1 \approx Vth_{42} - Vth_{41} + \frac{\sqrt{2\Delta I}}{\beta} \approx \frac{\sqrt{2\Delta I}}{\beta} \quad (6)$$

As described above, the current ($\Delta I$) flowing through the memory cell (1) gives rise to a voltage difference V2–V1 in the gate-source voltage of the MOSFETs 41 and 42. Further this voltage difference V2–V1 can be amplified by a differential amplifier (45) in a succeeding stage.

Consequently, according to the representative mode of realization (FIG. 2) of the present invention, it is possible to eliminate influences of the threshold voltage and the offset voltage of the MOSFET's in the sense amplifiers, to decrease signal amplitude in the common data line pair and to amplify information stored in the memory cell with a high speed.

An object of the present invention is to solve the problem of the prior art example and to make it possible to eliminate influences of the threshold voltage and the offset voltage of MOSFETs in sense amplifiers, to decrease signal amplitude in data lines and to amplify information stored in a memory cell with a high speed.

Other objects and characteristics of the present invention will be obvious from some following preferred embodiments.

DETAILED DESCRIPTION

Figures 1A, 1B:
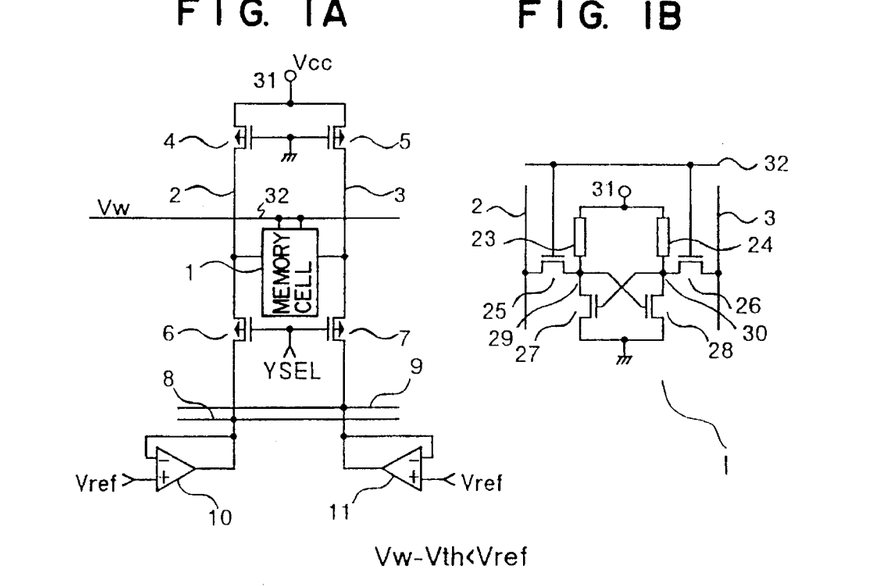
FIG. 1A is a circuit diagram for explaining the principle of the effect of decreasing signal amplitude in the common data line pair by using a differential amplifier according to the present invention.
FIG. 1B is another circuit diagram for explaining the principle of the effect of decreasing signal amplitude in the common data line pair by using a differential amplifier according to the present invention.

FIGS. 1A and 1B are circuit diagrams for explaining the principle of the effect of decreasing signal amplitude in the common data line pair by using a differential amplifier according to the present invention.

In FIGS. 1A and 1B, reference numeral 1 is a memory cell; 31 is a power supply terminal; 32 is a word line; 2 and 3 are a data line pair; 4 and 5 are P channel MOSFETs, which are loads of the data line pair 2 and 3, respectively; 6 and 7 are P channel MOSFETs serving as selector switches; 8 and 9 are a common data line pair; 10 and 11 are differential amplifiers for setting potentials of the common data line pair 8 and 9 to decrease signal amplitude therein; 23 and 24 are load elements of the memory cell; 25 and 26 are transmitting MOSFETs; 27 and 28 are driving MOSFETs; 29 and 30 are storing nodes in the memory cell.

In these embodiments indicated in FIGS. 1A and 1B, feedback circuits are formed by the fact that the data line pair (2, 3) are connected with the common data line pair (8, 9); the common data line pair (8, 9) are connected with output terminals of the respective differential amplifiers (10, 11); each of the output terminals is connected with a negative input terminal (−) of the respective differential amplifiers (10, 11); and a reference voltage (Vref) is applied to a positive input terminal (+) of each of the differential amplifiers (10, 11). That is, since the common data line pair (8, 9) act as output terminals of circuits using the differential amplifiers, so-called voltage follower circuits, it is possible to fix potentials of the common data line pair (8, 9) at a same value as the reference voltage (Vref) applied to the positive input terminal (+) of each of the differential amplifiers (10, 11). Consequently, it is possible to make signal amplitude in the common data line pair (8, 9) and the data lines (2, 3) extremely small.

On the other hand, in the present embodiments indicated in FIGS. 1A and 1B, the reference voltage (Vref) applied to the positive input terminal (+) of each of the differential amplifiers (10, 11) is set at a value obtained by subtracting the threshold voltage (Vth) of the transmitting MOSFETs (25, 26) from a voltage (Vw) of a word line (32) in the memory cell (1) in a state where it is selected. That is, a following inequality is satisfied;

Vw–Vth<Vref.

In this way, the potential of the data line pair (2, 3) can be kept at a value higher than Vw–Vth by applying a reference voltage (Vref) higher than Vw Vth to the positive input terminal (+) of each of the differential amplifiers (10, 11). For example, when information is stored with such a voltage that the storing node (30) in the memory cell (1) is at "H (high level)", in case where the potential of the data line (3) acting as the source electrode is kept under the same condition as the reference voltage (Vref>Vw–Vth), even if the word line (32) acting as the gate electrode of the transmitting MOSFET (26) is selected so that it is at Vw, the gate-source voltage is lower than the threshold voltage. Consequently, the transmitting MOSFET (26) is not in a conductive state. In this case, the signal voltage stored at the storing node (30) which is at the H level within the memory cell through the transmitting MOSFET (26) doesn't flow to the data line. Therefore, in these embodiments the signal voltage stored at the storing node (30) within the memory cell (1) does not drop so as to damage working margin, nor does the memory become weakened against soft error by a ray.

However, in the embodiments indicated in FIGS. 1A and 1B, it is not possible to take out a voltage proportional to a current coming from the memory cell (1). This point will be explained in a following embodiment.

FIG. 2 is a circuit diagram showing a first embodiment of the present invention, in which the present invention is applied to a semiconductor memory device having static type memory cells 1 (refer to FIGS. 1A and 1B) (e.g. static type random access memory cells).

Since basic construction and operation of the circuit indicated in FIG. 2 have been already explained, in order to avoid duplicate explanation, only points which have not been explained previously, will be explained below.

In FIG. 2, P channel MOSFETs 4 and 5 are connected between the power supply terminal 31 and the data line pair 2 and 3 as data line loads, respectively. The data line pair 2 and 3 are connected with the common data line pair 8 and 9 through the selector switches 6 and 7, respectively. Similarly, a plurality of pairs of data lines are connected with the common data line pair 8 and 9 through a plurality of selector switches, although this is not indicated in the figure.

Further, similarly to the reference voltage (Vref) shown embodiments in FIGS. 1A and 1B, the reference voltage (Vref) applied to the negative input terminal (–) of each of the differential amplifiers (10 and 11) in FIG. 2 is set at a value higher than that obtained by subtracting the threshold voltage (Vth) of the transmitting MOSFET (25, 26) in the memory cell (1) from the voltage (Vw) of the word line (32) in the selected state in the memory cell (1). As the result, the signal voltage stored at the storing node (30) which is at the high level within the memory cell (1) does not drop so as to damage working margin, nor does the memory become weakened against soft error by α ray.

Each of the two differential amplifiers 10 and 11 is composed of a plurality of MOSFETs. The channel length L and the channel width W of N channel sense MOSFETs 41 and 42 working in a saturation region by setting the reference voltage (Vref) are set so as to be equal to each other and the conductance B thereof is set so as to be extremely small. As a result, it is possible to take out a voltage proportional to a current ($\Delta I$) from the memory cell (1) as indicated by Eq. 5 previously given for the N channel sense MOSFETs 41 and 42.

That is, as indicated by Eq. 5 previously given, the drain voltages $V_{DS41}$ and $V_{DS42}$ of the N channel sense MOSFETs 41 and 42 are fixed at the reference voltage (Vref) by the feedback circuits constructed by the differential amplifiers 10 and 11, respectively, and drain currents Io–$\Delta I$ ($I_{DS41}$) and Io ($I_{DS42}$) different from each other flow therethrough. Consequently a potential difference corresponding to the conductances of the N channel MOSFETs 41 and 42 and the difference ($\Delta I$) between the drain currents takes place in the gate voltages V1 ($V_{GS41}$) and V2 ($V_{GS42}$) thereof. Here, if the conductance $\beta$ of the N channel MOSFETs 41 and 42 is set so as to be extremely small, as clearly seen from the equation, variations ($\Delta V$) in the gate voltages V1 ($V_{DS41}$) and V2 ($V_{GS42}$) are great with respect to variations ($\Delta I$) in the drain currents ($I_{DS41}$ and $I_{DS42}$). Therefore, although gain of the N channel MOSFETs 41 and 42 themselves decreases, gain of the differential amplifiers (or potential difference, which can be taken out as an output) increases.

Further, in general, when gate length of an MOSFET is increased, it is possible to suppress variations in the threshold voltage ($V_{th}$) due to process fluctuations, etc. to small values. Consequently, the gate length of the N channel MOSFETs 41 and 42, whose conductance may be small, being great, they can be so constructed that variations in the threshold voltage ($V_{th}$), etc. due to process fluctuations, etc. are suppressed to small values. On the contrary, the differential amplifiers 10 and 11 require relatively great conductances, because they drive the N channel MOSFETs 41 and 42 and the gate length of the MOSFETs constituting the differential amplifiers 10 and 11 is relatively small. However, since it is possible to eliminate influences of the threshold voltage and the offset voltage thereof by adopting the construction according to the present invention, conductances thereof can be satisfactorily great.

A final data signal can be obtained by further amplifying the signal transformed into a voltage by the two differential amplifiers 10 and 11 and the two N channel sense MOSFETs 41 and 42 by means of the differential amplifier 45 and by outputting it to a data bus or a data output buffer.

Figure 3A:
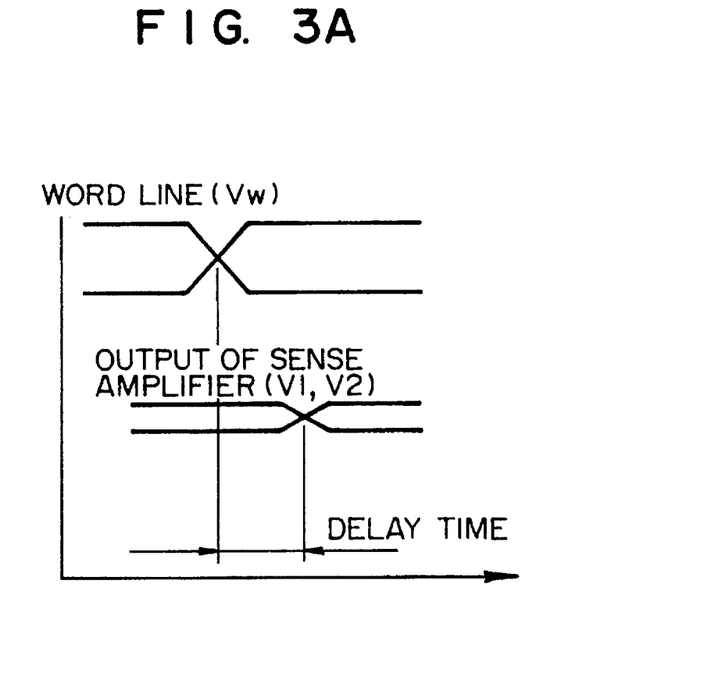
FIG. 3A is a diagram showing a simulation result, in which the effect of the first embodiment of the present invention indicated in FIG. 2 is compared with that obtained by the prior art method.
Figure 3B:
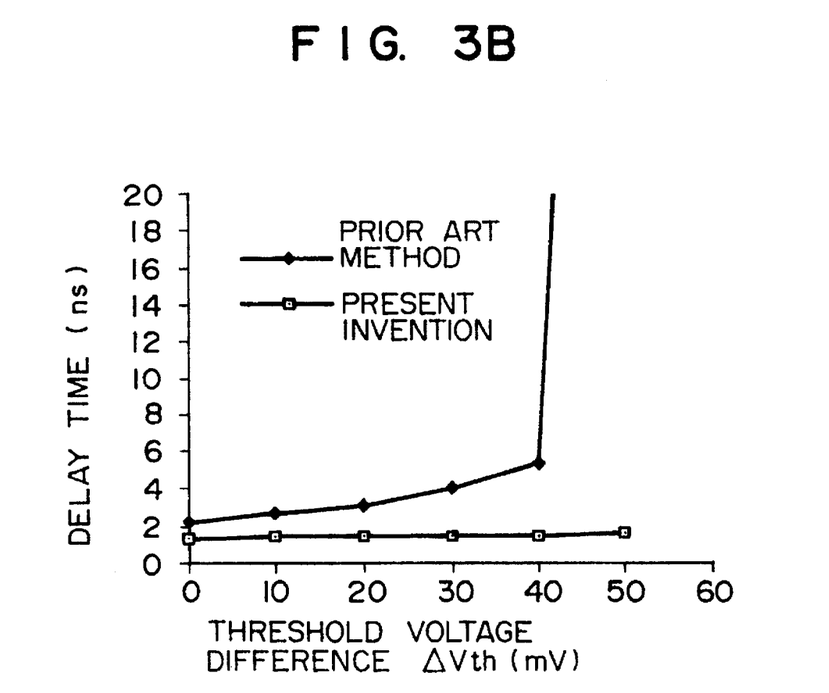
FIG. 3B is another diagram showing the simulation result, in which the effect of the first embodiment of the present invention indicated in FIG. 2 is compared with that obtained by the prior art method.

FIGS. 3A and 3B are diagrams showing a simulation result, in which the effect of the first embodiment of the present invention indicated in FIG. 2 is compared with that obtained by the prior art method. The simulation was effected under a condition using a power supply voltage of 2.5 V and a current consumption of 1.1 mA in a sense amplifier.

FIGS. 3A and 3B show variations in delay time in cases where the threshold voltage of one of the P channel MOSFETs used in the differential amplifiers 10 and 11 in the first embodiment of the present invention indicated in FIG. 2 and that of one of the P channel MOSFETs used in sense amplifiers according to the prior art method are varied. According to the prior art method, when variations in the threshold voltage $\Delta Vth$ increase, the delay time increases and when variations in the threshold voltage $\Delta Vth$ exceed 40 mV, the relevant MOSFET becomes finally inactive. On the contrary, according to the method described in the first embodiment of the present invention, even if the threshold voltage varies, the delay time barely increases. Also, the relevant MOSFET works without any problem for a variation of 50 mV in the threshold voltage. In addition, since signal amplitude in the common data lines can be small, it can be shown that working speed can be increased for a same electric power consumption with respect to the prior art method.

Figure 4:
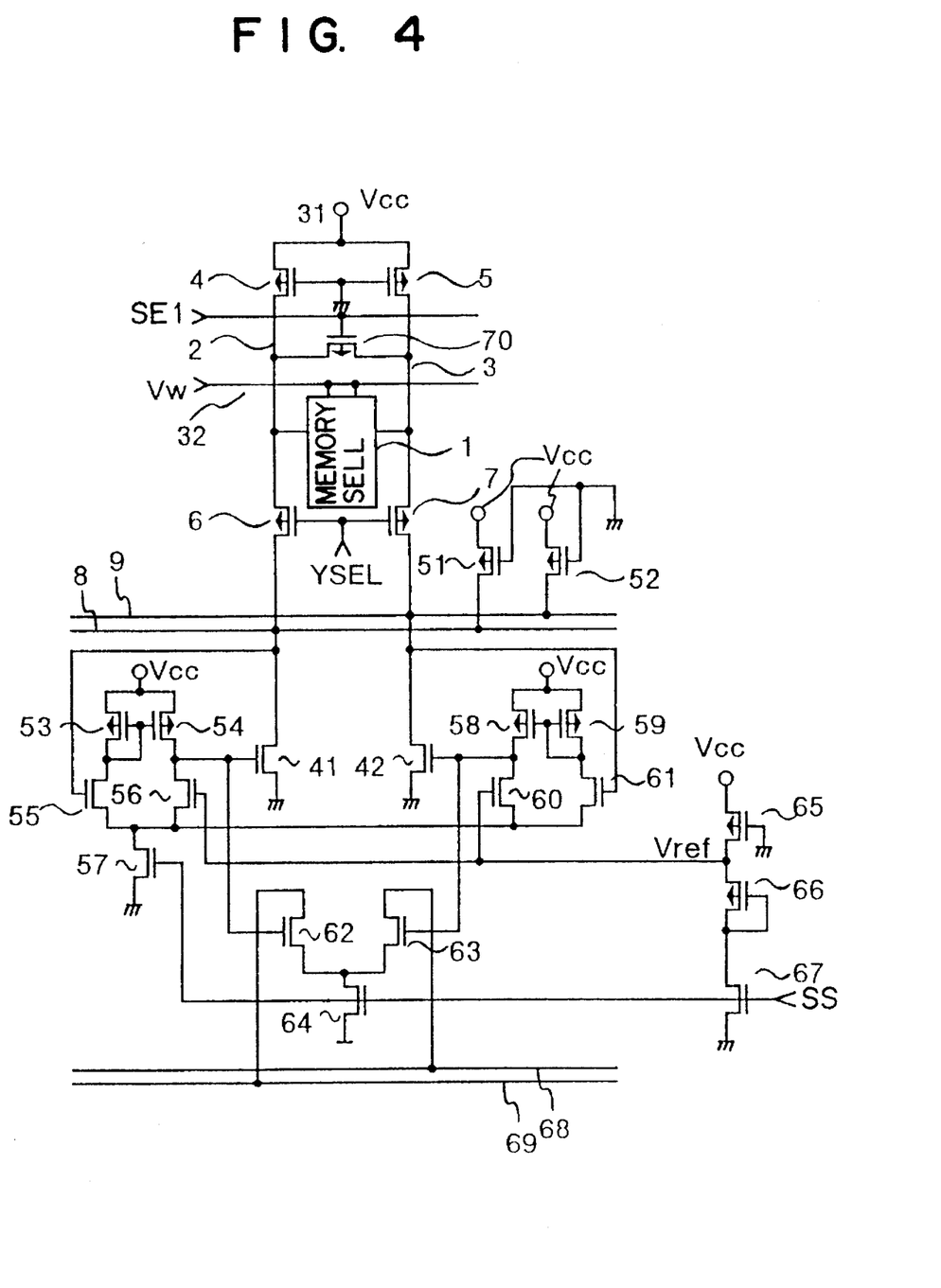
FIG. 4 is a circuit diagram showing a more concrete embodiment of the first embodiment indicated in FIG. 2.

FIG. 4 shows a more concrete embodiment of the first embodiment of the present invention indicated in FIG. 2, for explaining internal, construction of the differential amplifiers 10 and 11, etc. in detail. Points differing specifically from the embodiment indicated in FIG. 2 will be explained below.

In FIG. 4, reference numeral 70 is an equalizing P channel MOSFET for decreasing a potential difference between the data line pair; and 51 and 52 are P channel MOSFETs, which are loads of the common data line pair 8 and 9, respectively.

P channel MOSFETs 53 and 54 and N channel MOSFETs 55 and 56 constitute a current mirror type differential amplifier corresponding to the differential amplifier 10, while P channel MOSFETs 58 and 59 and N channel MOSFETs 60 and 61 constitute a current mirror type differential amplifier corresponding to the differential amplifier 11. On the other hand, an N channel MOSFET 57 constitutes a constant current source common to the two differential amplifiers 10 and 11 in FIG. 2.

P channel MOSFETs 65 and 66 and an N channel MOSFET 67 constitute a reference voltage generating circuit generating the reference voltage Vref. The P channel MOSFETs 65 and 66 are of depletion type, whose threshold voltage is negative.

N channel MOSFETs 62 and 63 forming a differential pair and an N channel MOSFET 64 in the constant current source constitute a current switch type differential amplifier driving data buses 68 and 69, which are a second common data line pair.

In the present embodiment indicated in FIG. 4, although the potential difference between the common data lines 8 and 9 can be extremely small owing to function of the differential amplifiers 53, 54, 55, 56, 57, 58, 59, 60 and 61, since the MOSFETs 6 and 7 in the selector act as resistors, the potential difference between the data line pair 2 and 3, i.e. the signal amplitude, cannot be so small as the potential difference between the data line pair 8 and 9. In such a case, the potential difference between the data line pair 2 and 3 can be made small by means of the equalizing MOSFET 70 disposed between the data line pair in the present embodiment. That is, in a data reading period (in the present embodiment, the period where a write control signal ($\overline{WE}$) is at a high level and an inverted signal (WE) thereof is at a low level), the potential difference between the data line pair 2 and 3 can be made small by the fact that a data line equalizing signal SE1 is at the low level and the P channel MOSFET 70 is set at the ON state. This data line equalizing signal SE1 may be a signal which can control the P channel MOSFET 70 so as to be at the ON state in the data reading period, and can be formed, for example by inverting the write control signal (/WE). Also, in this case characteristics of the present invention are not injured. Further, the signal transformed into a voltage by the sense amplifiers 53, 54, 55, 56, 57, 58, 59, 60 and 61 as well as the MOSFETs 41 and 42 may be outputted to the data buses 68 and 69 after having been transformed again into a current by means of a current switch type differential amplifier constituted by the MOSFETs 62, 63 and 64 as in the present embodiment.

In addition, a sense amplifier control signal SS is inputted to the MOSFET 67 constituting the reference voltage generating circuit, the MOSFET 57 constituting the constant current source for the current mirror type differential amplifier, and the MOSFET 64 constituting the constant current source for the current switch type differential amplifier. This signal SS turns the MOSFETs to the OFF state during a write operation. Owing to such a construction, it is possible to turn the differential amplifiers, etc. used for amplifying read out data to the OFF state during writing in the memory, thus reducing consumption of current flowing during the writing operation. The sense amplifier control signal SS may be a signal which can make the sense amplifiers inactive during the data writing. For example, the chip select signal ($\overline{CS}$) or a signal derived from the writing control signal ($\overline{WE}$) can be used therefor.

Figure 5:
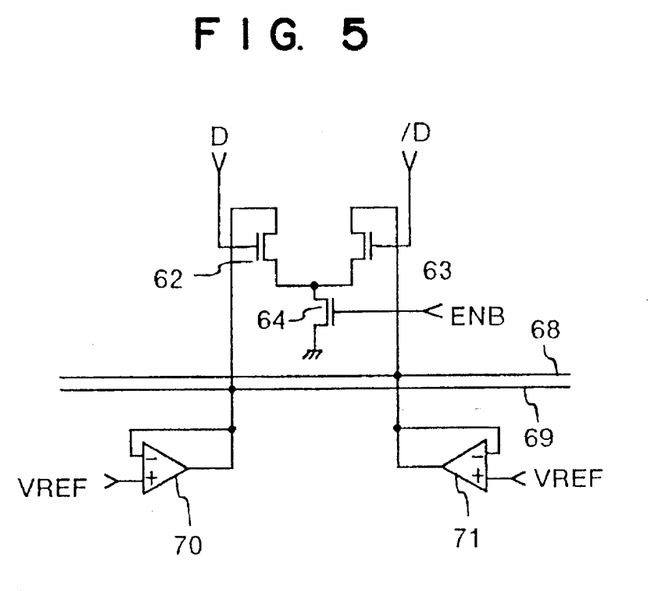
FIG. 5 is a circuit diagram for explaining the principle of the effect of decreasing signal amplitude in data buses 68, 69 indicated in FIG. 4.

FIG. 5 is a circuit diagram for explaining the principle of the effect of decreasing signal amplitude in the data buses 68 and 69 in FIG. 4.

In the present embodiment, the current switches 62, 63 and 64 are identical to those indicated in FIG. 4, and signals D and/D amplified by the sense amplifiers 53, 54, 55, 56, 57, 58, 59, 60 and 61 are transformed into current signals, which are outputted to the data buses 68 and 69.

In FIG. 5, potential setting of the data buses 68 and 69 is effected by using the differential amplifiers 70 and 71 in a negative feedback connection of voltage follower type, in order to decrease the signal amplitude in the data buses 68 and 69. In this way an effect of decreasing the delay time in the data buses can be obtained, similarly to the embodiments indicated in FIGS. 1A and 1B. However, in the present embodiment indicated in FIG. 5, it is impossible to take out any voltage proportional to current from the memory cell. This point will be explained below.

Figure 6A:
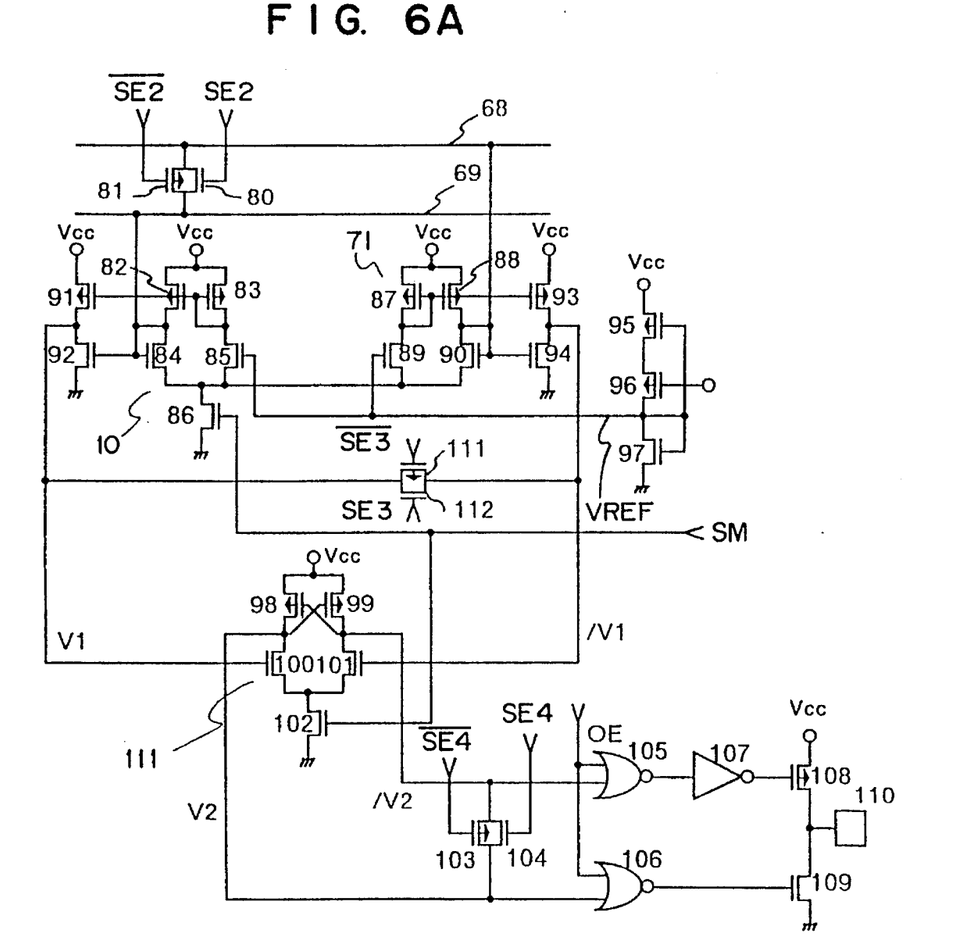
FIG. 6A is a circuit diagram showing an embodiment, by which it is possible to decrease signal amplitude in data buses used in the embodiment indicated in FIG. 4 and also to take out a voltage proportional to a current from a memory cell to the data buses.
Figure 6B:
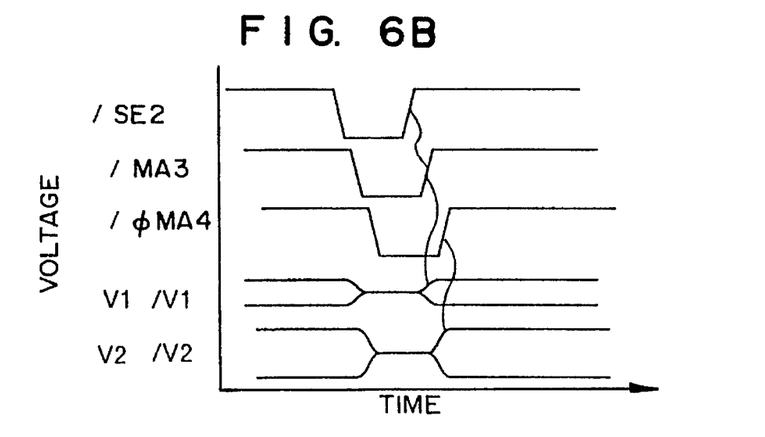
FIG. 6B is a diagram showing working waveforms in the embodiment, by which it is possible to decrease signal amplitude in the data buses used in the embodiment indicated in FIG. 4 and also to take out a voltage proportional to a current from a memory cell to the data buses.

FIGS. 6A and 6B are a circuit diagram, by which it is possible to decrease signal amplitude in the data buses 68 and 69 in FIG. 4 and also to take out a voltage proportional to a current from a memory cell to the data buses 68 and 69, and a diagram showing waveforms therein, respectively. Signals in the data buses 68 and 69 can be outputted finally through a data output terminal 110 of the chip.

In FIGS. 6A and 6B, reference numerals 80 and 81 are equalizing MOSFETs for decreasing the potential difference between the data buses 68 and 69. P channel MOSFETs 82 and 83 and N channel MOSFETs 84, 85 and 86 constitute a current mirror type differential amplifier. This current mirror type differential amplifier acts as a voltage follower by connecting the drain and the gate of the N channel MOSFET 84. As the result, the data bus 69 is set at a potential almost equal to the reference voltage from the reference voltage generating circuit constituted by P channel MOSFETs 95 and 96 and an N channel MOSFET 97. The potential of the data bus 69 is slightly varied by the current switches 62, 63 and 64 in FIG. 4. An N channel MOSFET 92 in a pushpull buffer responds to this slight signal and, on the other hand, a P channel MOSFET 91 responds to a signal at the gates of the P channel MOSFETs 82 and 83 constituting a current mirror with a same phase as this slight signal to output an amplified signal voltage V1.

Similarly, P channel MOSFETs 87 and 88 and N channel MOSFETs 89 and 90 constitute a current mirror type differential amplifier. This current mirror type differential amplifier acts as a voltage follower by connecting the drain and the gate of the N channel MOSFET 90. As the result, the data bus 68 is set at a potential almost equal to the reference voltage from the reference voltage generating circuit constituted by the P channel MOSFETs 95 and 96 and the N channel MOSFET 97. The potential of the data bus 69 is slightly varied by the current switches 62, 63 and 64 in FIG.

4. An N channel MOSFET 94 in a pushpull buffer responds to this slight signal and on the other hand, a P channel MOSFET 93 responds to a signal at the gates of the P channel MOSFETs 87 and 88 constituting a current mirror with a same phase as this slight signal to output an amplified signal voltage /V1.

For example, in the case where the gate electrode MOSFET 63 connected with the data bus 68 of the current switch type differential amplifier is turned to the high level, current flows from Vcc to the data bus 68 through the source-drain path of the P channel MOSFET 88. The data bus 68 is set at the reference voltage (VREF) by the differential amplifier 70 and potential of the data bus 68 is slightly varied by the current switches 62, 63 and 64 in FIG. 4. The gate voltage of the P channel MOSFET 88 is lowered, because it tries to keep the potential of the data bus 68 at the reference voltage (VREF). Consequently, the gate voltage of the P channel MOSFET 93, whose gate electrode is connected with the gate electrode of the P channel MOSFET 88, is also lowered to output an amplified signal voltage /V1.

These amplified signal voltages V1 and /V1 are transferred to the gates of a P channel MOSFET 108 and an N channel MOSFET 109 in the last output stage through NOR circuits 105 and 106 and an inverter 107 after having been amplified by a differential amplifier constituted by load P channel MOSFETs 98 and 99 connected in load cross-couple, N channel MOSFETs 100 and 101 forming a differential pair, and an N channel MOSFET 102 forming a constant current source.

Further, the present embodiment is provided with an N channel MOSFET 80 and a P channel MOSFET 81 in order to equalize the data buses 68 and 69 in the data reading period. These N channel MOSFET 80 and P channel MOSFET 81 are controlled by data bus equalizing signals $\overline{SE2}$ and $\overline{SE2}$ ($\overline{SE2}$ being an inverted signal of SE2), respectively. Similarly, the present embodiment is provided with an N channel MOSFET 112 and a P channel MOSFET 111 in order to equalize the amplified signal voltages V1 and /V1. The P channel MOSFET 111 and the N channel MOSFET 112 are controlled by main amplifier equalizing signals SE3 and $\overline{SE3}$, respectively. Further, the present embodiment is-provided with an N channel MOSFET 104 and a P channel MOSFET 103 in order to equalize amplified signal voltages V2 and /V2 of a differential amplifier 111, whose loads are cross-coupled. MOSFETs 103 and 104 are controlled by main amplifier equalizing signals SE4 and $\overline{SE4}$, respectively.

As indicated by the waveform diagram in FIG. 6B, the embodiment allows further increase in speed by equalizing the data buses 68 and 69, etc. when compared to the speed obtained in cases where data are inverted without equalizing.

Furthermore, the present embodiment is constructed so as to interrupt operation of the differential amplifiers 70, 71 and 120, and to decrease useless current consumption in the data writing period by controlling the N channel MOSFETs 86 and 102; thus acting as a current source for the differential amplifiers 70, 71 and 120. A main amplifier control signal SM controlling the N channel MOSFETs 86 and 102 may be a signal capable of interrupting operation of the differential amplifiers 70, 71 and 120 in the data writing period. The data bus equalizing signal SE2 and $\overline{SE2}$ can be used therefor.

Figure 7:
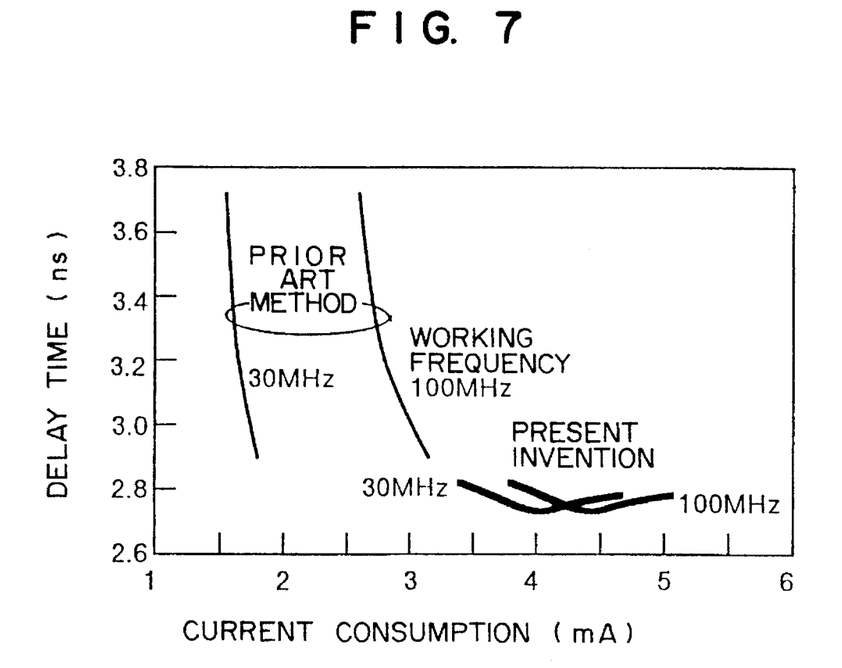
FIG. 7 is a diagram showing effects of the embodiments indicated in FIGS. 6A and 6B.

FIG. 7 shows the effect of the embodiment indicated in FIGS. 6A and 6B, in which delay time is obtained by simulation, using working frequency as a parameter.

As indicated in FIG. 7, according to the prior method, current consumption increases with increasing working frequency. This is because amplitude in the data buses increases and AC current component increases. On the contrary, according to the present method, the current consumption increases only slightly, even if the working frequency increases. Consequently, according to the present method, an effect can be obtained such that the working frequency can be increased without current increase.

Figure 8:
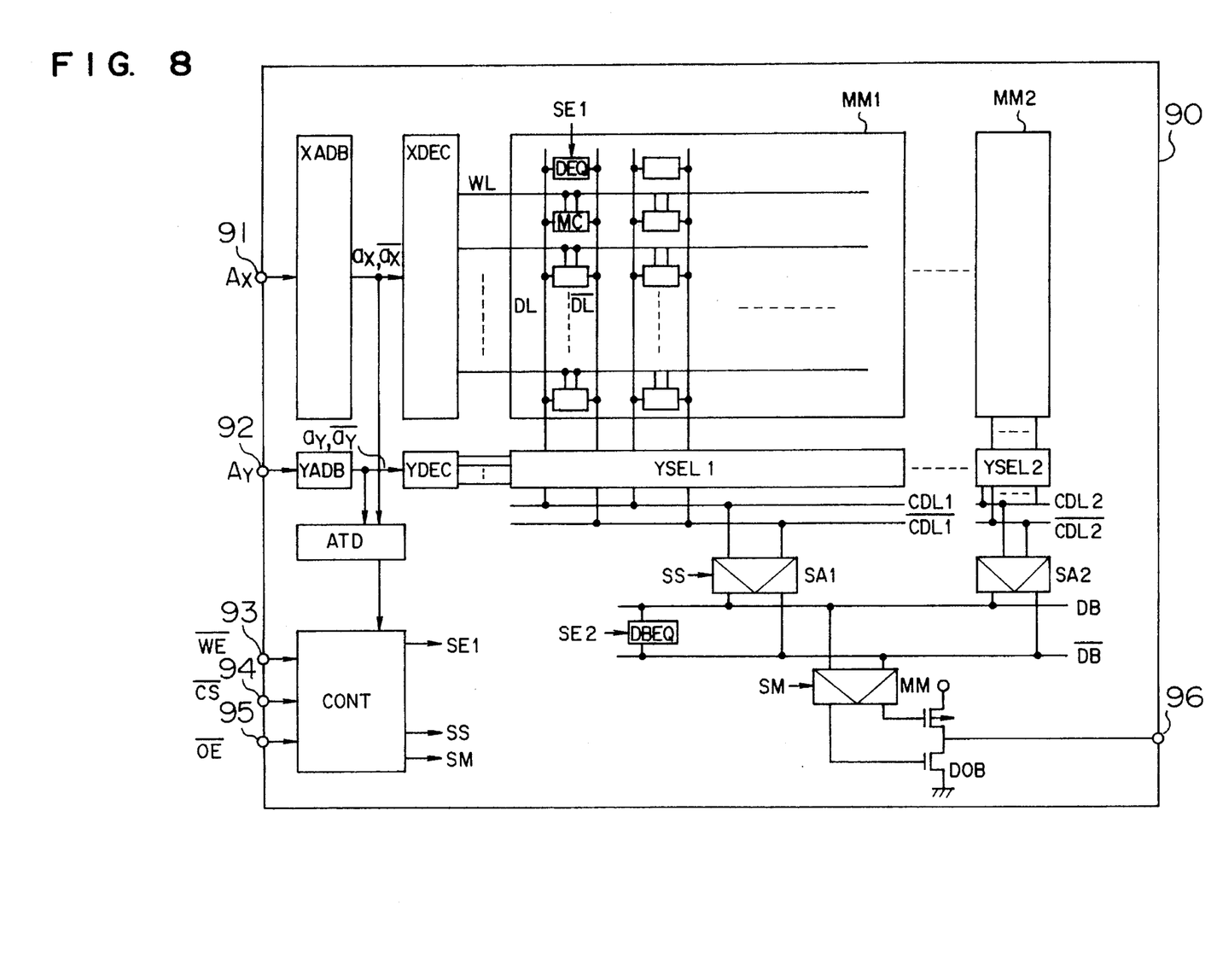
FIG. 8 is a diagram showing an embodiment, in which the present invention is applied to a semiconductor memory device.

FIG. 8 shows an embodiment, in which sense amplifiers and a main amplifier according to the present invention are applied to a semiconductor memory device (particularly static type random access memory).

In the figure, reference numeral 90 represents a semiconductor memory device, which is fabricated on one single semiconductor substrate. MC indicates a memory cell acting as a data storing unit. MM1 indicates a memory mat, in which a plurality of memory cells MC are arranged in a matrix form. Although not specifically restricted, a plurality of memory mats (MM1, MM2) are formed in the semiconductor memory device 90.

When information stored in the memory cell MC is read out, an X address and a Y address corresponding to the memory cell MC, from which information stored therein is to be read out, are inputted to an X address terminal 91 and Y address terminal 92, respectively. The inputted x address Ax is transformed into complementary address signals ax and $\overline{ax}$ by an X address buffer XADB, which are supplied to an X decoder XDEC. The X decoder XDEC decodes the inputted complementary, address signals ax and $\overline{ax}$ to select a single word line WL, corresponding to the inputted X address Ax. When the word line WL is selected, a plurality of memory cells connected with the word line WL are made active to output data to a plurality of pairs of data lines DL and $\overline{DL}$ connected with the respective, memory cells MC. The plurality of pairs of data lines DL and $\overline{DL}$, to which the data are outputted, are selectively connected with the pair of common data lines CDL and $\overline{CDL}$ by a column selecting circuit YSEL. The selection by means of the column selecting circuit YSEL is effected through a Y address buffer YADB and a Y decoder YDEC, corresponding to the Y address Ay, similarly to the X address Data signals outputted to the data line pair CDL and $\overline{CDL}$ are transferred to a sense amplifier SA1, according to the present invention, to be amplified. This sense amplifier SA1 is constructed e.g. by the differential amplifiers 10, 11 and 45 as well as the MOSFETs 41 and 42 indicated in FIG. 2. More concretely speaking, it is constructed by the circuit indicated in FIG. 4. The data signals amplified by the sense amplifier SA 1 are subsequently transferred to the data buses DB and $\overline{DB}$, further amplified by the main amplifier according to the present invention, and outputted to the exterior of the semiconductor memory device from an output terminal 96 through an output buffer DOB. This main amplifier is constructed e.g. by the differential amplifiers 70 and 71 indicated in FIG. 5. More concretely speaking, it is constructed by the circuit indicated in, FIG. 6A. Although not specifically restricted, the sense amplifiers (SA1, SA2) are disposed in each of memory mats (MM1, MM2) and constructed so as to amplify data signals selectively outputted to common data line pairs (CDL1, $\overline{CDL1}$, CDL2, $\overline{CDL2}$) which are disposed similarly in each of the memory mats (MM1, MM2). They are so constructed that outputs of the sense amplifiers (SA1, SA2) are connected with the data buses DB and/DB in common.

In this semiconductor memory device, since the sense amplifiers and the main amplifier according to the present invention are used, the signal amplitude in the common data line pairs and the data buses can be suppressed and, thus, it is possible to read out data signals with a high speed.

Further, as indicated in FIG. 4, the data line equalizing circuit DEQ connected with each of the data line pairs is constructed e.g. by a transistor (70 in FIG. 4) selectively short-circuiting the relevant data line pair. The data bus equalizing circuit DBEQ is constructed e.g. by the transistors (80 and 81 in FIG. 6A) selectively short-circuiting the relevant data buses, as indicated in FIG. 6A. It is possible to remove potential difference between the data line pair DL and $\overline{DL}$, as well as between the data buses DB and $\overline{DB}$ at reading out data and to shorten address access time by controlling these data line equalizing circuit DEQ and data bus equalizing circuit DBEQ so as to equalize the data line pair DL and $\overline{DL}$ as well as the data buses DB and $\overline{DB}$ at writing data by using the data line equalizing signals SE1 and /SE1 as well as the data bus equalizing signals SE2 and $\overline{SE2}$, respectively.

Further a sense amplifier control signal SS is supplied to each of the sense amplifiers (SA1, SA2) to control them so that they are made inactive in a data signal writing period, as indicated in FIG. 4. Similar a main amplifier control signal SM is supplied to the main amplifier M to control it so that it is made inactive in a data signal writing period, as indicated in FIG. 6A.

A control circuit CONT receives a write control signal $\overline{WE}$ supplied from the exterior of the semiconductor memory device 90, a chip select signal $\overline{CS}$, an output enable signal $\overline{OE}$ and an output signal of an address change detecting circuit ATD. The CONT generates the data line equalizing signal SE1 and the data bus equalizing signal SE2 which control equalization of the dam line pairs, etc. It also generates internal control signals such as the sense amplifier control signal SS, which controls the sense amplifiers, etc., the main amplifier control signal SM, etc. Although not specifically restricted, the data line equalizing signal SE1 is formed on the basis of the write control signal $\overline{WE}$. On the other hand, the data bus equalizing signal SE2, the sense amplifier control signal SS, and the main amplifier control signal SM are formed on the basis of the write control signal $\overline{WE}$ and the output signal of the address change detecting circuit ATD. The sense amplifier control signal SS can also be formed by using a mat selecting signal obtained by decoding the Y address apart from the write control signal $\overline{WE}$ and the output signal of the address change detecting circuit ATD. In a type of memory devices in which a reference clock is supplied from the exterior, it is also possible to use a reference clock signal in lieu of the output signal of the address change detecting circuit ATD.

Although several preferred embodiments of the present invention have been explained in the above, the present invention is not restricted to the embodiments, but it is a matter of course that various modifications are possible in the scope of the technical ideas thereof.

Figure 9:
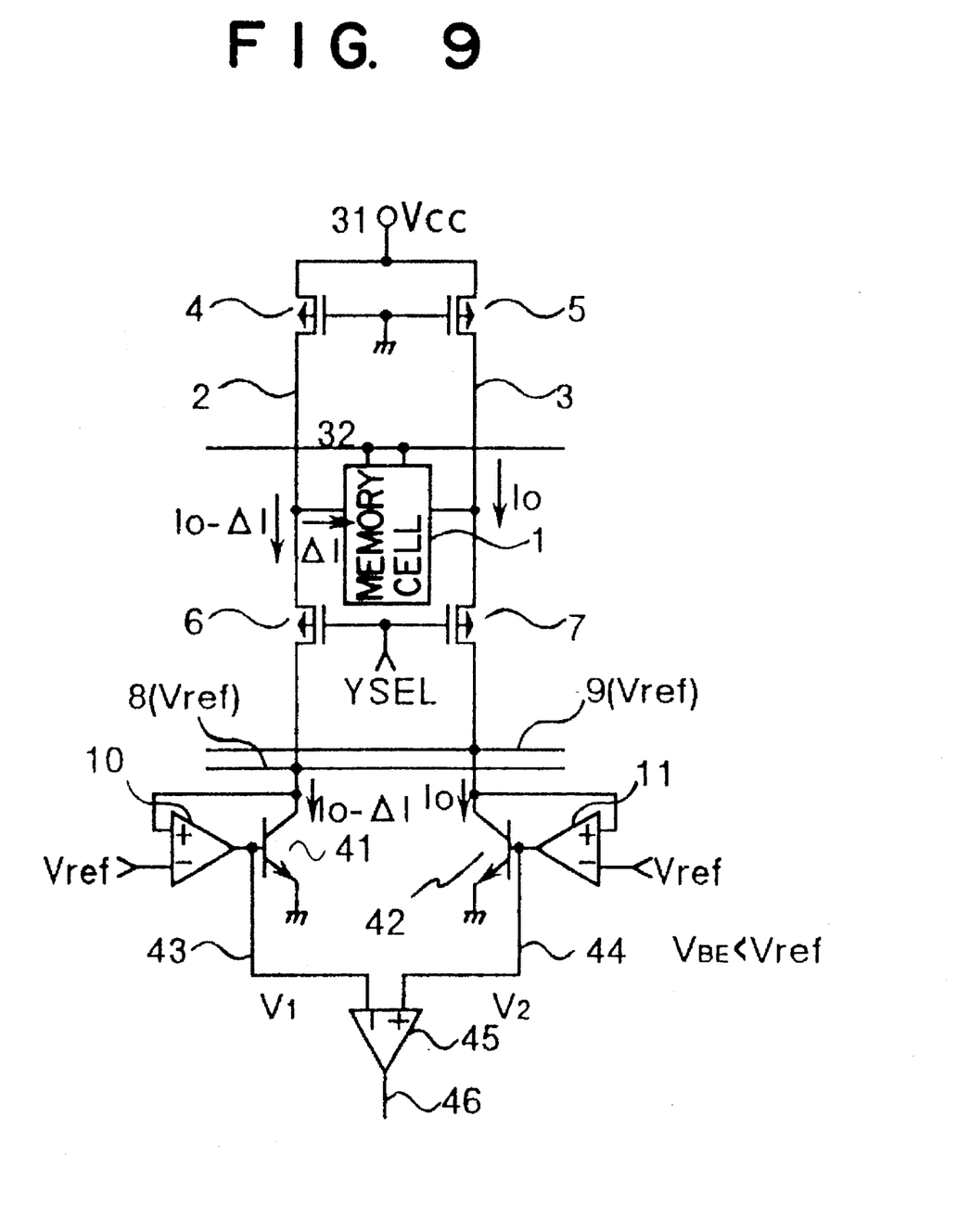
FIG. 9 is a circuit diagram showing a circuit according to a modified embodiment of the present invention.

For example, the two sense transistors 41 and 42 may be bipolar transistors, as indicated in FIG. 9. However, in this case, it is necessary to set the reference voltage (Vref) 80 as to satisfy the following relation so that the base potential (base-emitter voltage $V_{BE}$ of the transistors 41 and 42) is lower than the collector potential ($V_{ref}$) and thus the NPN type bipolar transistors 41 and 42 work in an unsaturation region:

$$VB_{BE} < V_{ref}$$

When the NPN type bipolar transistors 41 and 42 work in an unsaturation region as described above, collector current of the bipolar transistors 41 and 42 are given by following equations, respectively;

$$V1 = V_{BE41} = \frac{KT}{q} \ln \frac{Io - \Delta I}{Is} \tag{7}$$

$$V2 = V_{BE42} = \frac{KT}{q} \ln \frac{Io}{Is} \tag{8}$$

where K represents the Boltzmann's constant, T the absolute temperature, and Is the saturation current.

Consequently, the voltage difference between the bases of the bipolar transistors 41 and 42 is given by a following equation;

$$|V2 - V1| = V_{BE42} - V_{BE41} = \frac{KT}{q} \ln \frac{\Delta I}{Io} \tag{9}$$

As explained above, the present invention controls the effect of the threshold voltage and the offset voltage of the MOSFETs in the sense amplifiers. According to the present invention, it is possible to amplify information stored in a memory cell with a high speed by decreasing signal amplitude in the data lines.

What is claimed is:

1. A semiconductor memory device comprising:
   a plurality of memory cells;
   a plurality of data line pairs connected with said plurality of memory cells;
   a common data line pair connected with said plurality of data line pairs;
   a first differential amplifier, whose positive input terminal is connected with one of said common data line pair, while a reference voltage is applied to a negative input terminal thereof;
   a second differential amplifier, whose positive input terminal is connected with the other of said common data line pair, while a reference voltage is applied to the negative input terminal thereof;
   a first transistor, whose input electrode is connected with an output of said first differential amplifier, while an output electrode thereof is connected with said one of said common data line pair; and
   a second transistor, whose input electrode is connected with an output of said second differential amplifier, while an output electrode thereof is connected with said other of said common data line pair.

2. A semiconductor memory device according to claim 1, wherein said first transistor and said second transistor are MOSFETs and the MOSFETs work in a saturation region by setting said reference voltage at a predetermined value.

3. A semiconductor memory device according to claim 1, wherein said first transistor and said second transistor are bipolar transistors and the bipolar transistors work in an unsaturation region by setting said reference voltage at a predetermined value.

4. A semiconductor memory device according to claim 1, wherein two input terminals of a third differential amplifier are connected with said input electrode of said first transistor and said input electrode of said second transistor.

5. A semiconductor memory device according to claim 2, wherein two input terminals of a current switch circuit are connected with said input electrode of said first transistor and said input electrode of said second transistor.

6. A semiconductor memory device comprising:
   a plurality of memory cells;
   a plurality of word lines connected with said plurality of memory cells;
   a plurality of data line pairs connected with said plurality of memory cells;

a common data line pair including a first common data line and a second common data line, connected with said plurality of data line pairs;

a first circuit, having an output terminal that is connected with said first common data line, for fixing potential of said first common data line; and a second circuit, having an output terminal that is connected with said second common data line, for fixing potential of said second common data line.

7. A semiconductor memory device according to claim 6, wherein:

said first circuit includes a first voltage follower circuit, having an output terminal that is connected with said output terminal of said first circuit and having an input terminal that is connected with a reference voltage; and said second circuit includes a second voltage follower circuit, having output terminal that is connected with said output terminal of said second circuit and having an input that is terminal connected with a reference voltage.

8. A semiconductor static random access memory device comprising:

a memory cell having a pair of transfer MOSFETs, a pair of driver MOSFETs and a pair of loads;

a data line pair respectively connected with said transfer MOSFETs;

a word line connected with gate electrodes of said transfer MOSFETs;

a common data line pair connected with said data line pair;

a first MOSFET, whose drain electrode is connected with one line of said data line pair;

a second MOSFET, whose drain electrode is connected with another line of said data line pair;

a first circuit having a first input terminal coupled to a reference voltage, a second input terminal connected with one of said data line pair and an output terminal connected with a gate electrode of said first MOSFET;

a second circuit having a first input terminal coupled to a reference voltage, a second input terminal connected with one of said data line pair and an output terminal connected with a gate electrode of said second MOSFET; wherein said first circuit controlling said gate electrode of said first MOSFET for decreasing a potential difference between said reference voltage and said another line of data line pair; and said second circuit controls said gate electrode of said second MOSFET for decreasing potential difference between said reference voltage and said another line of data line pair.

9. A semiconductor static random access memory device according to claim 8, in which the following inequality is satisfied:

Vw−Vth<Vref wherein, Vref is a value of said reference voltage, Vth is a value of a threshold voltage of said transfer MOSFET and Vw is a value of a voltage of said word line in a state where it is selected.

10. A semiconductor static random access memory device according to claim 8, wherein said first and second MOSFET work in a saturation region by setting said reference voltage at a predetermined value.

11. A semiconductor static random access memory device according to claim 8 further comprising:

a third circuit, having a first input terminal connected with a gate electrode of said first MOSFET and a second input terminal connected with a gate electrode of said second MOSFET, said third circuit sensing a potential difference between said first input terminal of said third circuit and said second input terminal of said third circuit.

12. A semiconductor static random access memory device according to claim 11, in which:

said third circuit is a differential amplifier circuit for sensing said potential difference and outputting the amplified potential difference.

13. A semiconductor static random access memory device according to claim 11, in which said third circuit is a current switch type differential amplifier circuit.

14. A semiconductor static random access memory device according to claim 8 further comprising:

an equalizing circuit disposed between said data line pair, which equalizes the potential of said data line pair in a data reading period.

15. A static random access memory comprising:

a plurality of memory mats which have a plurality of data line pairs, a plurality of word lines and a plurality memory cells connected with one of said data line pairs and one of said word line;

a plurality of common data line pairs which are disposed in each of said memory mats and connected with said data line pairs:

a plurality of sense amplifiers which are disposed in each of said memory mats and connected with one of said common data line pairs;

a data bus pair connected with said plurality of sense amplifiers;

a main amplifier connected with said data bus pair; wherein said sense amplifier having a pair of differential amplifiers, each having positive input terminals that are connected with a different common data line of said common data line pair, while a reference voltage is applied to negative input terminals thereof, and said sense amplifier having a pair of MOSFETs, each having gate electrodes connected with an output of one of said differential amplifiers, while drain electrodes thereof are connected with said common data line pair.

16. A static random access memory according to claim 15, wherein said main amplifier having a pair of differential amplifiers, whose positive input terminals are each connected with a different data bus of said data bus pair, while a reference voltage is applied to negative input terminals thereof; and said main amplifier having a pair of MOSFETs, whose gate electrodes are connected with an output of said differential amplifiers, while drain electrodes thereof are connected with said data bus pair.

17. A static random access memory according to claim 16, wherein said sense amplifier having a sensing circuit, that has input electrodes that are connected with gate electrodes of said MOSFETs of said sense amplifier and output electrodes that are connected with said data bus pair, said sensing circuit sensing a potential difference between said input electrodes of said sensing circuit.

18. A static random access memory according to claim 17, wherein said main amplifier having a sensing circuit, having input electrodes that are connected with gate electrodes of said MOSFETs in said main amplifier, for sensing a potential difference between said input electrodes and outputting a signal corresponding to the sensing result.

\* \* \* \* \*